(12) United States Patent
Lee

(10) Patent No.: US 6,780,763 B2
(45) Date of Patent: Aug. 24, 2004

(54) METHOD FOR FABRICATING SEMICONDUCTOR DEVICE CAPABLE OF IMPROVING GAP-FILL PROPERTY

(75) Inventor: Sung-Kwon Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/612,944

(22) Filed: Jul. 7, 2003

(65) Prior Publication Data

US 2004/0127015 A1 Jul. 1, 2004

(30) Foreign Application Priority Data

Dec. 26, 2002 (KR) ................................ 10-2002-0084224

(51) Int. Cl.[7] .......................................... H01L 21/4763
(52) U.S. Cl. ...................... 438/643; 438/629; 438/643; 438/586; 438/286
(58) Field of Search ................................ 438/643, 629, 438/586, 286

(56) References Cited

U.S. PATENT DOCUMENTS 5,362,666 A * 11/1994 Dennison ..................... 438/396

* cited by examiner

*Primary Examiner*—George Fourson
*Assistant Examiner*—Julio J. Maldonado
(74) *Attorney, Agent, or Firm*—Jacobson Holman PLLC

(57) ABSTRACT

The present invention provides a method for fabricating a semiconductor device capable of improving a gap-fill property of a conductive wire. To achieve this effect, the inventive method includes the steps of: forming a plurality of conductive patterns on a substrate in the first region and the second region, wherein each of the conductive patterns includes sequentially stacked layers of a conductive layer and a hard mask; removing the hard mask in the second region to expose the conductive layer; forming a diffusion barrier layer on the exposed conductive layer; depositing an insulation layer on the entire resulting substrate structure in the first region and the second region; selectively etching the insulation layer in the second region to form an opening exposing the diffusion barrier layer; and forming a conductive wire electrically connected to the diffusion barrier layer through the opening.

8 Claims, 5 Drawing Sheets

METHOD FOR FABRICATING SEMICONDUCTOR DEVICE CAPABLE OF IMPROVING GAP-FILL PROPERTY

FIELD OF THE INVENTION

The present invention relates to a method for fabricating a semiconductor device; and, more particularly, to a method for fabricating a semiconductor device capable of improving a gap-fill property of a conductive wire.

DESCRIPTION OF RELATED ARTS

As a cell size of a semiconductor memory device has been extensively micronized, a capacitor height needs to be increased in order to secure a high capacitance, and this trend further results in an increase of a thickness of an insulation layer.

To meet a demand of large-scale integration, a specific range of an etch thickness of the insulation layer for insulating each unit device is required to make a contact with another insulation layer at bottom. For instance, the etch thickness of the insulation layer for making a connection with a power line of a bit line ranges from about about 15000 Å to about 20000Å.

An implementation of a hard mask partially solves a problem of an excessive etch of an etch target for forming a deep contact hole. However, the more severe problem arose from the above etch process for forming the deep contact hole is a bowing profile wherein an etched surface slightly gets bent.

In the etch process for forming the deep contact hole, the above bowing phenomenon takes place at a thickness of the etch target, e.g., the insulation layer, typically ranging from about 2000 Å to about 10000Å.

The factor causing the bowing phenomenon is radicals or ion bombardments that make the insulation layer etched excessively at the thickness in a range from about 2000 Å to about 10000 Å. The incident ions and radicals are reflected at the aforementioned thickness and causes bottom parts to be etched, and thereby pronouncing the bowing phenomenon at the bottom portions.

Also, the bowing phenomenon gives rise to a void generation in the course of burying a conductive wire or plug material into a contact hole, and the void generation may further induce a seam generation.

Figure 1:
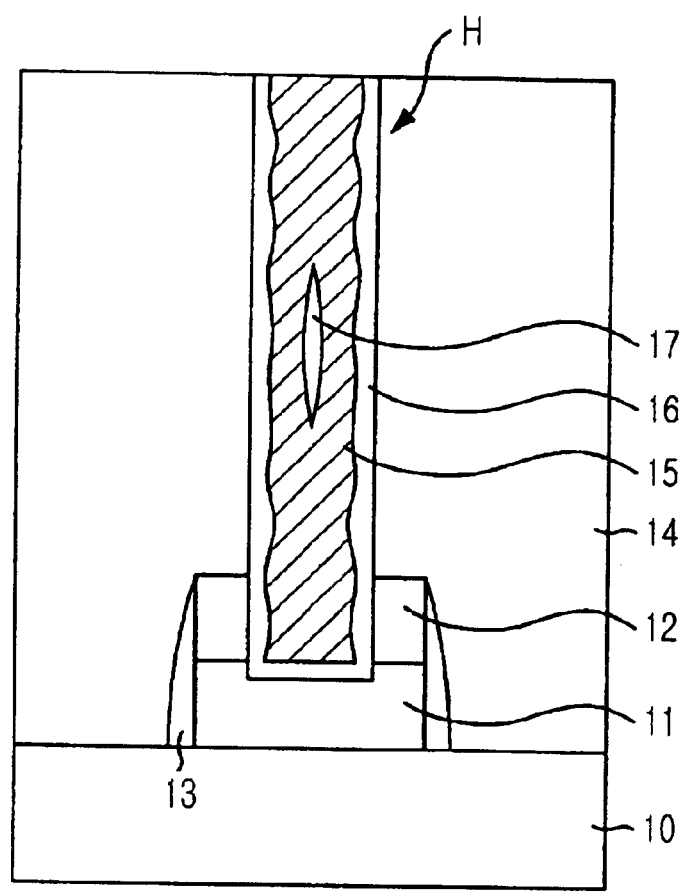

FIG. 1 is a cross-sectional view showing a peripheral circuit region completed with a metal wire formation of a conventional semiconductor memory device.

As shown, a conductive layer 11 and an insulation layer 12 for a hard mask (hereinafter referred to as a hard mask insulation layer) are sequentially stacked to form a bit line pattern on a substrate 10. At lateral sides of the bit line pattern, an insulation layer 13 for a spacer (hereinafter referred to as a spacer insulation layer) is formed.

Herein, the conductive layer 11 is made of poly-silicon or tungsten. The hard mask insulation layer 12 and the spacer insulation layer 13 are nitride-based layers having a higher etch tolerance than that of a silicon oxide layer. Examples of the nitride-based layer are a silicon nitride layer and a silicon oxynitride layer.

On top of the bit line pattern, an insulation layer 14 is formed, and an opening H, i.e., a contact hole, is formed by passing through the insulation layer 14 and the hard mask insulation layer 12. Then, a diffusion barrier layer 16 is formed along lateral walls and a bottom surface of the contact hole H. A conductive wire 15 such as a metal wire or a plug is filled into the contact hole H.

Meanwhile, the insulation layer 14 is formed in the peripheral circuit region while a capacitor is formed in a cell region. Thus, the insulation layer 14 has a thick thickness of above about 10000 Å. Also, the insulation layer 14 has a structure with more than double layers.

As the semiconductor device has been highly integrated, the thickness of the insulation layer 14 is also increasingly augmented in order to improve the capacitance. On the other hand, a width of the bit line pattern gets narrower. As a result of these trends, an aspect ratio of the contact hole H also increases proportionally.

However, a gap-fill property of the conductive wire 15 is degraded because the diffusion barrier layer 16 is previously formed in a region of the contact hole H having a narrow width. Therefore, the void (refer to 17 shown in FIG. 1) is generated within the conductive wire 15. Particularly, the void may be a main cause for degrading an electric property of the semiconductor device.

Furthermore, the conductive wire 15 has a relatively low resistivity but a high resistance because of the degraded gap-fill property.

Accordingly, it is critical to develop a specific method for improving the gap-fill property of the conductive wire formed through the use of the deep contact hole.

SUMMARY OF THE INVENTION

It is, therefore, an object of the present invention to provide a method for fabricating a semiconductor device including a conductive wire formed with use of a deep contact hole in order to efficiently improve a gap-fill property of the conductive wire.

In accordance with an aspect of the present invention, there is provided a method for fabricating a semiconductor device divided into a first region and a second region peripheral to the first region, the method including the steps of: forming a plurality of conductive patterns on a substrate in the first region and the second region, wherein each of the conductive patterns includes sequentially stacked layers of a conductive layer and a hard mask; removing the hard mask in the second region to expose the conductive layer; forming a diffusion barrier layer on the exposed conductive layer; depositing an insulation layer on the entire resulting substrate structure in the first region and the second region; selectively etching the insulation layer in the second region to form an opening exposing the diffusion barrier layer; and forming a conductive wire electrically connected to the diffusion barrier layer through the opening.

BRIEF DESCRIPTION OF THE DRAWING(S)

The above and other objects and features of the present invention will become apparent from the following description of the preferred embodiments given in conjunction with the accompanying drawings, in which:

FIG. 1 is a cross-sectional view showing a peripheral circuit region completed with a metal wire formation of a conventional semiconductor memory device; and FIGS. 2A to 2F are cross-sectional views showing processes for fabricating a semiconductor device including a conductive wire in accordance with a preferred embodiment of the present invention.

DETAILED DESCRIPTION OF THE INVENTION

Hereinafter, with reference to FIGS. 2A to 2F, a method for fabricating a semiconductor device including a conductive wire will be described in more detail.

FIGS. 2A to 2F are cross-sectional views illustrating processes for fabricating the semiconductor device including the conductive wire in accordance with a preferred embodiment of the present invention.

Figure 2A:
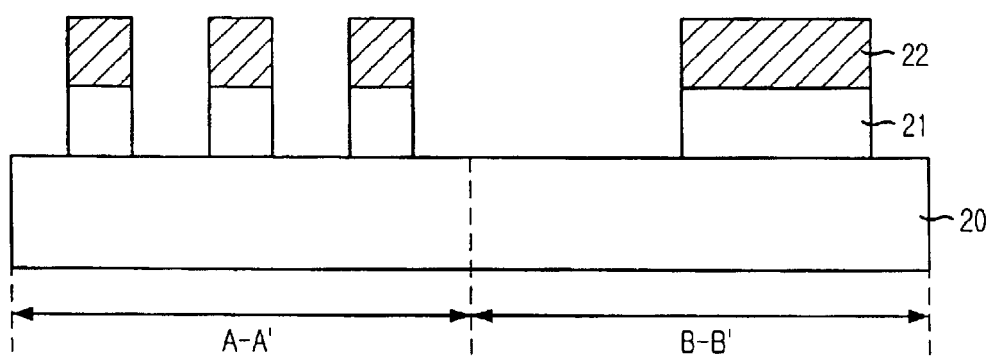

Referring to FIG. 2A, a conductive layer 21 and an insulation layer for a hard mask 22 (hereinafter referred to as a hard mask) are sequentially deposited on a substrate 20 providing various elements of the semiconductor device.

Herein, the conductive layer 21 is made of Ti, W, TiN or polysilicon. The hard mask 22 is formed with a nitride-based material such as silicon nitride or silicon oxynitride to thereby have a different etch selectivity from an oxide layer used for an inter-layer insulation layer.

Next, a mask for forming a conductive pattern, e.g., a bit line pattern, is formed and subsequently used as an etch mask when the hard mask 22 and the conductive layer 21 are etched. From this etch process, a plurality of bit line patterns are formed. Especially, each bit line includes the conductive layer 21 and the hard mask 22. Thereafter, a nitride-based etch stop layer 23 is deposited along a bit line profile.

This resulting structure is shown in FIG. 2A. Also, in FIG. 2A, the sections A–A' and B–B' represent a cell region and a peripheral circuit region, respectively.

Figure 2B:
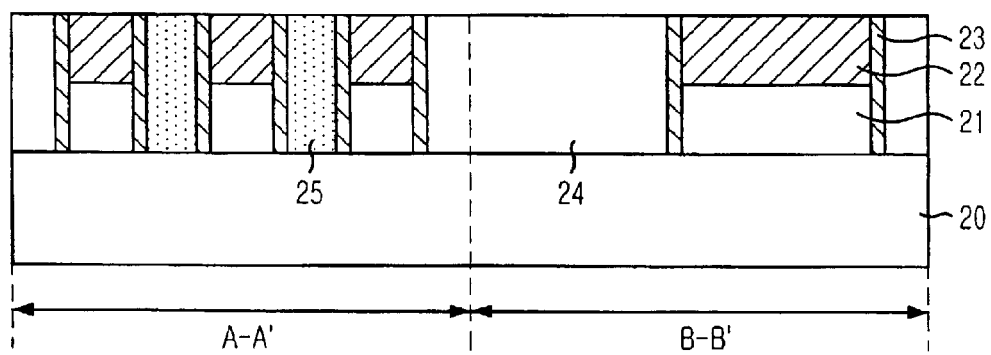

As shown in FIG. 2B, a typical oxide-based first inter-layer insulation layer 24 is deposited on the etch stop layer 23. The first inter-layer insulation layer 24 is a single or stack layer of an oxide-based material. The oxide-based material includes boron-phosphorus-silicate glass (BPSG), low pressure tetra-ethyl-ortho silicate (LPTEOS), plasma enhanced tetra-ethyl-ortho silicate (PETEOS), phosphorus-silicate glass (PSG) or boron-silicate glass (BSG).

Next, an organic anti-reflective layer (not shown) is coated on the first insulation layer 24. The anti-reflective layer performs its characteristic function of preventing scattering reflections during a photo-exposure process. Particularly, organic materials are used for the anti-reflective layer to make ease of etching and removing a photoresist pattern for ArF (hereinafter referred to as ArF photoresist pattern).

Continuous to the anti-reflective layer coating, a photoresist is coated on the anti-reflective layer, and then, a photo-etching process using a light source of ArF or KrF is performed. From this photo-etching process, the photoresist pattern (not shown) for a cell contact is formed.

More specifically, the photoresist is coated on the anti-reflective layer until reaching a predetermined thickness. Afterwards, a predetermined portion of the photoresist is selectively photo-exposed by using the above light source (not shown) and a predetermined reticle (not shown). A subsequent developing process makes those portions photo-exposed or non-photo-exposed after the photo-exposure process remain. Thereafter, etch remnants are removed by a succeeding cleaning process to thereby form the photoresist pattern.

Next, the photoresist pattern is used as an etch mask to sequentially etch the first insulation layer 24 and the etch stop layer 23 in the cell region A–A', whereby a contact hole (not shown) for forming a cell contact pad 25 is formed. Herein, the above etch process is a self-aligned contact (SAC) process. After forming the contact hole, a photoresist strip process is performed to remove the photoresist pattern and the anti-reflective layer, and a cleaning process is then proceeded to remove etch remnants produced during the above SAC process.

Then, a conductive material for forming the contact pad 25 (hereinafter referred to as a contact pad conductive material) is deposited along a profile containing the contact hole until being sufficiently filled into the contact hole. Herein, polysilicon or tungsten can be an example of the contact pad conductive material.

Under an etch target of exposing the hard mask 22, a blanket-etch process or a chemical mechanical polishing (CMP) process is performed to form a plurality of the contact pads 25 that are isolated from each other and contacted to a bottom portion of the substrate 20. This resulting structure including the plurality of the contact pads 25 in the cell region A–A' is shown in FIG. 2B.

Figure 2C:
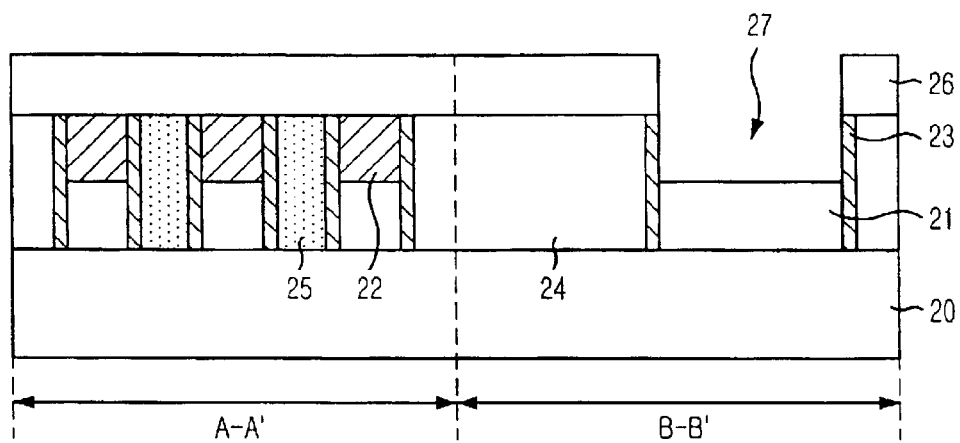

Next, with reference to FIG. 2C, a photoresist is coated on the above entire structure, and then, a photo-exposure and a developing processes are performed to form a photoresist pattern 26 for opening an upper portion of the bit line pattern in the peripheral circuit region B–B'.

The conductive layer 21 is exposed by removing the hard mask 22 of the bit line pattern in the peripheral circuit region B–B' with use of the photoresist pattern 26 as an etch mask. At this time, a width of the photoresist pattern 26 is larger than that of a typical via hole pattern for connecting a power line of a bit line pattern by about 20% to about 50% thereof.

Figure 2D:
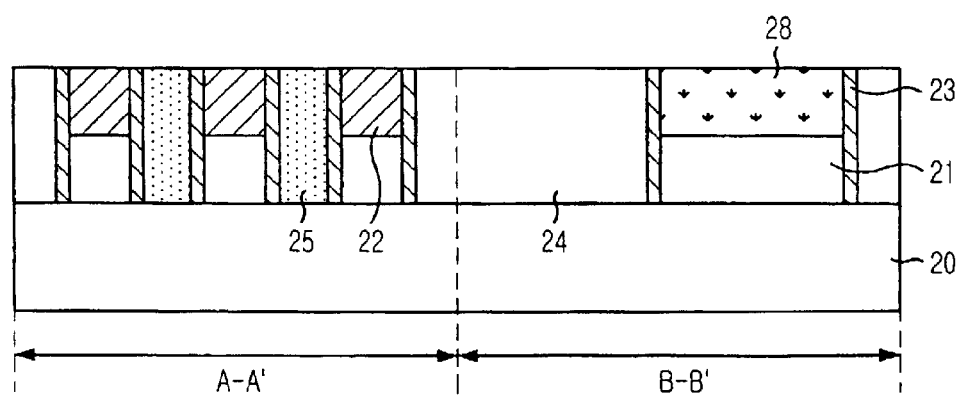

Referring to FIG. 2D, a diffusion barrier layer 28 is formed on the conductive layer 21 exposed by the removal of the hard mask 22. In particular, the diffusion barrier layer 28 is formed to impede metal from being diffused into the bottom layers, and thereby preventing degradation of an electric property. Therefore, the diffusion barrier layer 28 is preferably made of at least one material selected from a group consisting of Ti, TiN, TiW, Ta and TaN. As shown in FIG. 2D, at this time, the bit line pattern has a stack structure of the conductive layer 21 and the diffusion barrier layer 28 formed after removing the hard mask 22 in the peripheral circuit region B–B'.

Figure 2E:
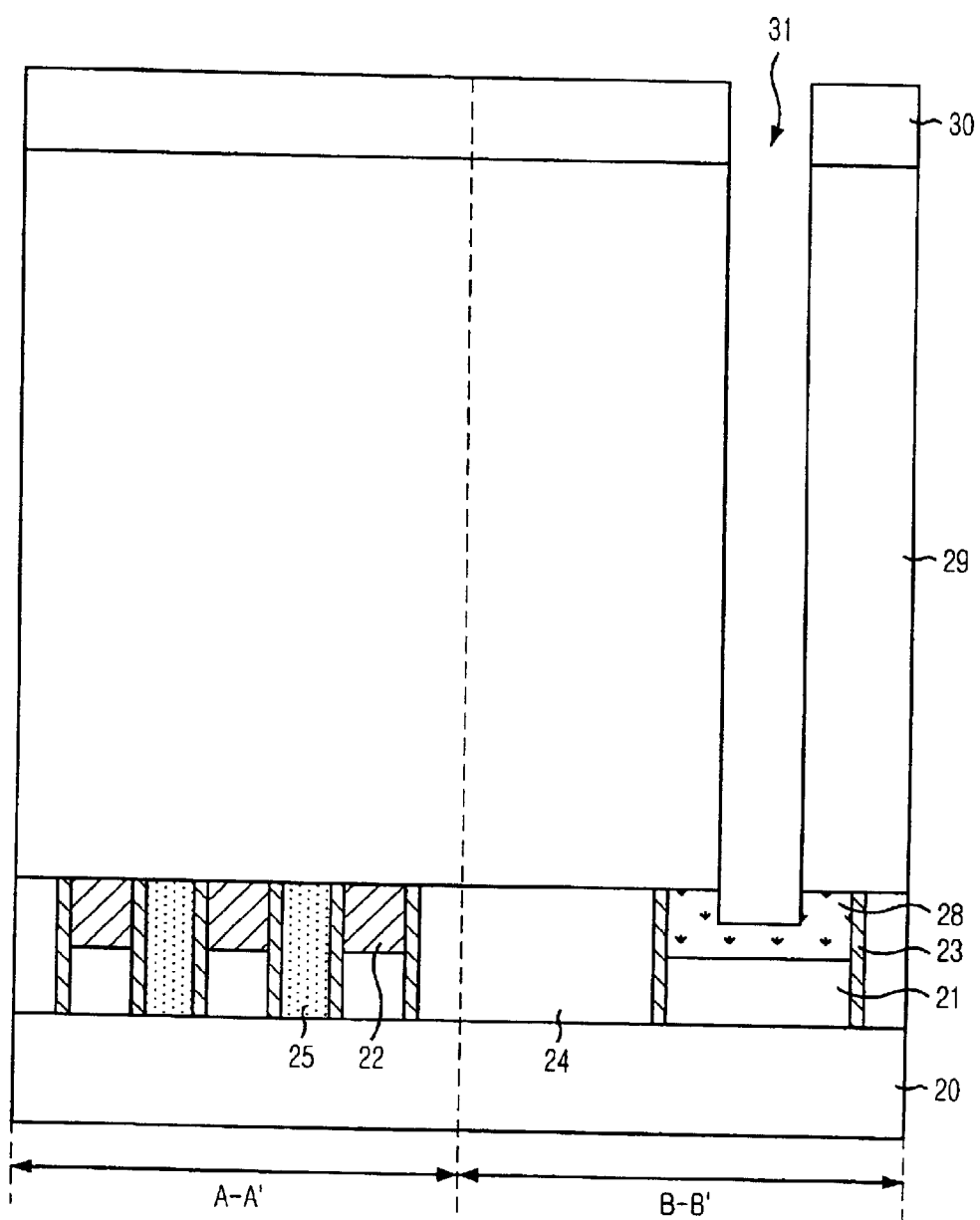

Referring to FIG. 2E, in the cell region A–A', a storage node and a capacitor formation processes are performed. At this time, a plurality of insulation layers are formed. However, in this preferred embodiment, these insulation layers are expressed as a second insulation layer 29.

The second insulation layer 29 has a structure with multiple layers of an oxide-based material. The oxide-based material includes BPSG, LPTEOS, PETEOS, PSG, BSG, advanced planarization layer (APL), spin-on-glass (SOG), spin-on-dopant (SOD), high density plasma (HDP).

Next, a via hole 31 for connecting the power line of the bit line pattern in the peripheral circuit region B–B' is formed.

In more detail of the via hole 31 formation, a photoresist pattern 30 for exposing the diffusion barrier layer 28 in the peripheral circuit region B–B' is formed. The second insulation layer 29 is etched with use of the photoresist pattern 30 as an etch mask so as to form the via hole 31 exposing the diffusion barrier layer 28.

Figure 2F:
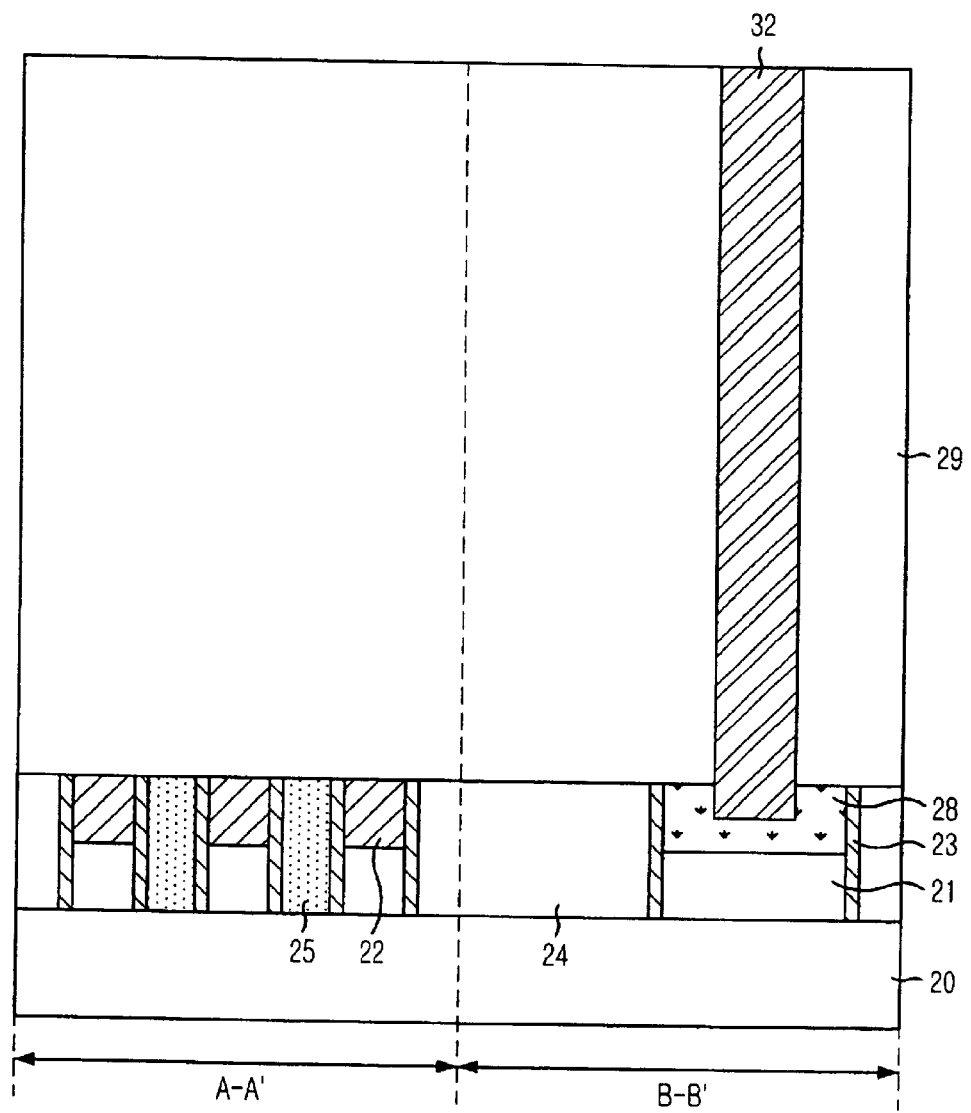

As shown in FIG. 2F, the via hole 31 is then buried with a conductive material so as to be electrically connected to the exposed diffusion barrier layer 28. Then, the deposited conductive material is planarized to form a conductive wire 32.

Herein, the conductive material for the conductive wire 32 can be any material selected from a group consisting of Al, Cu, TiN and W and includes typical materials for a metal wire and a contact pad. Also, the conductive material is deposited through the use of a chemical vapor deposition (CVD) process. Furthermore, the metal wire can be connected to an upper part of the conductive layer and an active region of the substrate in addition to the electrical connection of the conductive metal wire to the diffusion barrier layer.

By forming the diffusion barrier layer on a spot where the hard mask is deposited and etched and subsequently forming the via hole, it is possible to prevent the void generation while the via hole is filled with the conductive material for the conductive wire. This effect further provides an effect of preventing the degradation of electrical property.

The preferred embodiment of the present invention exemplifies the cell region and the peripheral circuit region of the semiconductor memory device. However, the present invention can be still applicable for other types of semiconductor devices. In addition to the bit line pattern, it is possible to apply the present invention to a gate electrode pattern and a metal wire.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device having a first region and a second region, comprising the steps of:

forming a plurality of conductive patterns on a substrate in the first region and the second region, wherein each of the conductive patterns includes sequentially stacked layers of a conductive layer and a hard mask;

removing the hard mask in the second region to expose the conductive layer;

forming a diffusion barrier layer on the exposed conductive layer;

depositing an insulation layer on the entire resulting substrate structure in the first region and the second region;

selectively etching the insulation layer in the second region to form an opening exposing the diffusion barrier layer; and forming a conductive wire electrically connected to the diffusion barrier layer through the opening.

2. The method as recited in claim 1, wherein the first region is a cell region of a semiconductor memory device and a second region is a peripheral region of the semiconductor memory device.

3. The method as recited in claim 2, wherein each of the conductive patterns is a bit line pattern.

4. The method as recited in claim 1, wherein the diffusion barrier layer uses at least any material selected from a group consisting of Ti, TiN, TiW, Ta and TaN.

5. The method as recited in claim 1, wherein the hard mask is made of a nitride-based material.

6. The method as recited in claim 1, wherein the conductive wire is made of any material selected from a group consisting of Al, Cu, Ag, Au or W.

7. The method as recited in claim 1, wherein the conductive wire is a metal wire for connecting a power line to the conductive layer and the opening is a via hole.

8. The method as recited in claim 7, wherein the metal wire is substantially connected to an upper part of the conductive layer and an active region of the substrate in addition to the electrical connection of the conductive metal wire to the diffusion barrier layer.

* * * * *